(12) United States Patent
Hsieh (10) Patent No.: US 7,176,516 B2
(45) Date of Patent: Feb. 13, 2007

(54) STRUCTURE AND FABRICATING METHOD TO MAKE A CELL WITH MULTI-SELF-ALIGNMENT IN SPLIT GATE FLASH

(75) Inventor: Chia-Ta Hsieh, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 10/963,029

(22) Filed: Oct. 12, 2004

(65) Prior Publication Data

US 2005/0062095 A1    Mar. 24, 2005

Related U.S. Application Data

(62) Division of application No. 10/178,384, filed on Jun. 24, 2002.

(51) Int. Cl.
    *H01L 29/76* (2006.01)
(52) U.S. Cl. ............... 257/314; 257/315; 257/E29.129; 257/E21.68
(58) Field of Classification Search ........ 257/314–321, 257/E29.129, E21.422, E21.179, E21.68, 257/E21.683, E21.686, E21.678, E21.688, 257/E29.3, E29.76, E21.681, E21.682, E21.69; 438/257–267, 201, 211
See application file for complete search history.

(56) References Cited

U.S. PATENT DOCUMENTS

| 5,023,680 | A  | * | 6/1991 | Gill et al. ................. 257/317 |
| 6,204,126 | B1 |   | 3/2001 | Hsieh et al. ............... 438/267 |
| 6,211,012 | B1 | * | 4/2001 | Lee et al. .................. 438/257 |
| 6,229,176 | B1 |   | 5/2001 | Hsieh et al. ............... 257/316 |
| 6,232,179 | B1 | * | 5/2001 | Sato ......................... 438/257 |
| 6,242,308 | B1 |   | 6/2001 | Hsieh et al. ............... 438/265 |
| 6,259,131 | B1 |   | 7/2001 | Sung et al. ................ 257/315 |
| 6,593,187 | B1 |   | 7/2003 | Hsieh ....................... 438/257 |
| 6,610,570 | B2 |   | 8/2003 | Chen ........................ 438/257 |

* cited by examiner

*Primary Examiner*—Brook Kebede
(74) *Attorney, Agent, or Firm*—Thomas, Kayden, Horstemeyer & Risley (57) ABSTRACT

A new structure is disclosed for semiconductor devices with which contact regions are self-aligned to conductive lines. Openings to a gate oxide layer, in partially fabricated devices on a silicon substrate, having insulating sidewalls. First polysilicon lines disposed against the insulating sidewalls extend from below the top of the openings to the gate oxide layer. Oxide layers are grown over the top and exposed sides of the first polysilicon lines serving to insulate the first polysilicon lines. Polysilicon contact regions are disposed directly over and connect to silicon substrate regions through openings in the gate oxide layer and fill the available volume of the openings. Second polysilicon lines connect to the contact regions and are disposed over the oxide layers grown on the first polysilicon lines.

15 Claims, 11 Drawing Sheets

STRUCTURE AND FABRICATING METHOD TO MAKE A CELL WITH MULTI-SELF-ALIGNMENT IN SPLIT GATE FLASH

CROSS-REFERENCE TO RELATED APPLICATION

This application is a division of U.S. patent application Ser. No. 10/178,384, filed Jun. 24, 2002.

BACKGROUND OF THE INVENTION

1. Field of the Invention

The present invention relates generally to semiconductor integrated circuit technology and more particularly to split gate memory cells used in flash EPROMs (Electrically Erasable Programmable Read Only Memory).

2. Description of Prior Art

Increased performance in computers is often directly related to a higher level of circuit integration. Tolerances play an important role in the ability to shrink dimensions on a chip. Self-alignment of components in a device serves to reduce tolerances and thus improve the packing density of chips. Other techniques can be important in shrinking device size. A method is disclosed later in the embodiments of the present invention of forming a structure with self-aligned source to floating gate, wordline to floating gate and bitline contact to wordline, which allows for significant reduction in the area of the split gate flash cell.

As is well known in the art, split gate flash cells have bitlines and wordlines and bitline contacts that connect bitlines to drain regions. Bitlines and bitline contacts are traditionally insulated from wordlines by an interlevel dielectric layer. The separation between bitline contacts and wordlines must be maintained large enough so as to avoid possible shorts that could develop between adjacent bitline contacts and wordlines. Bitline contact to wordline separations are determined by the positions of bitline contact openings, which are set by a design rule. In arriving at the design rule the possibility of misalignment must be taken into account, which results in a required separation well beyond that needed to avoid development of shorts. This requirement for increased separation, arising from the need to account for unavoidable misalignment, limits the ability to decrease cell size. Self-alignment of the bitline contact to the wordline, as in the structures disclosed by the present invention, eliminates the reliability issue, allows a reduction in cell area and facilitates shrinking the cell size. Furthermore, in the structures disclosed by the present invention there is, in addition to self-aligned bitline contact to wordline, also self-alignment of source to floating gate and wordline to floating gate; allowing a further reduction in cell area and further facilitating shrinking the cell size.

Figure 1A:
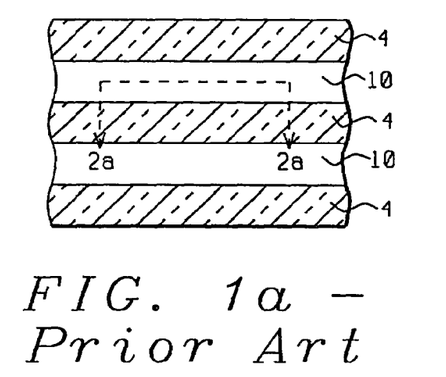
FIGS. 1a–1g show top views depicting a traditional method of forming split gate flash memory cells.
Figure 1B:
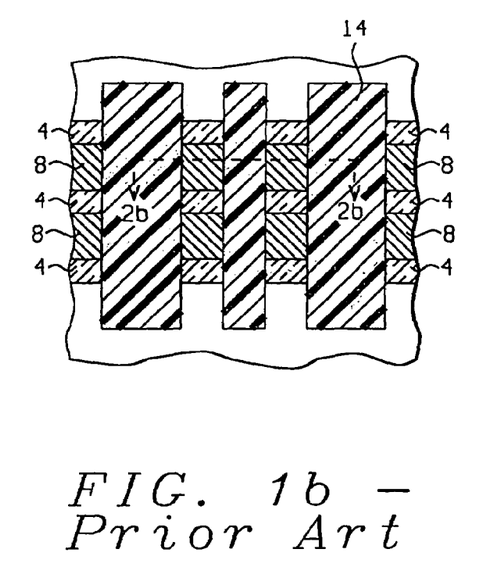
Figure 1C:
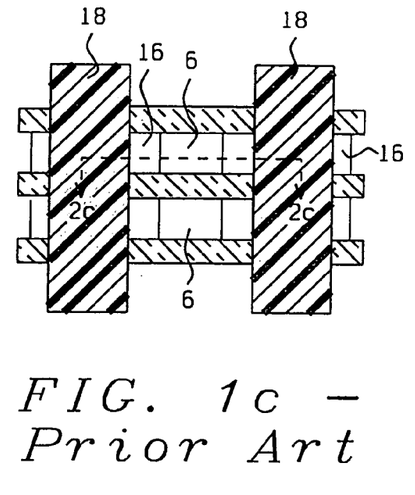
Figures 1D, 2D:
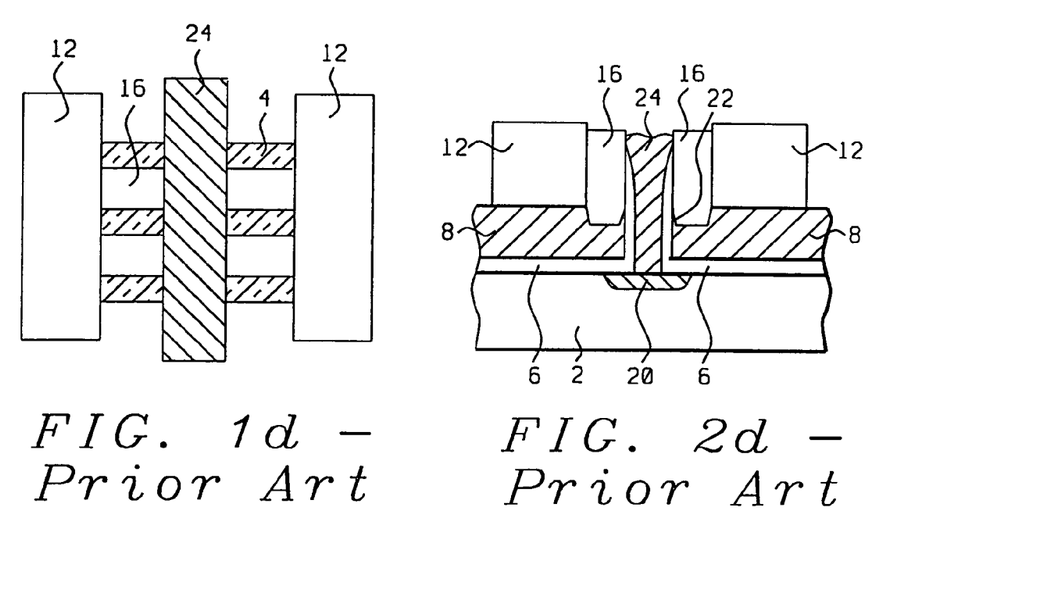
FIGS. 2a–2g show cross sectional views depicting a traditional method of forming split gate flash memory cells.
Figures 1E, 2E:
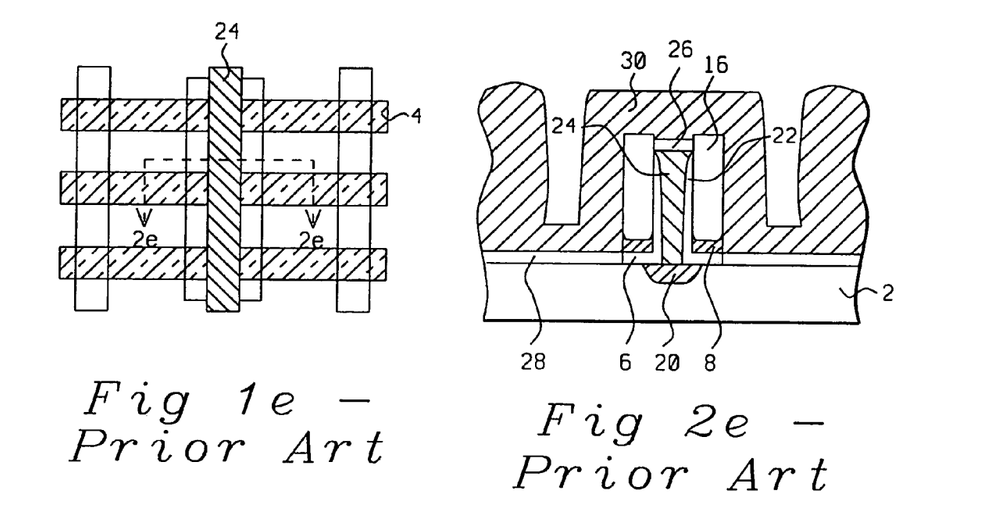
Figure 1F:
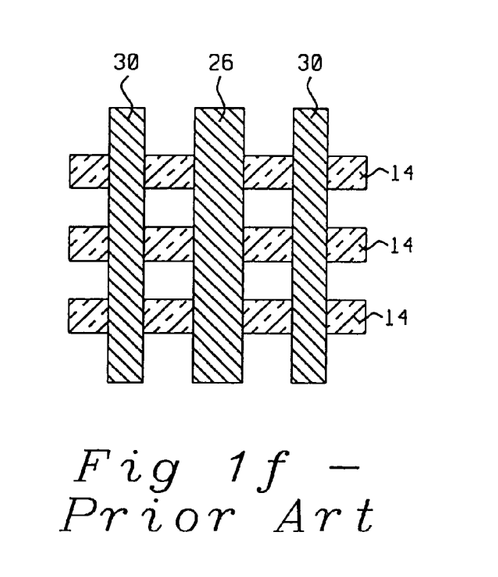
Figure 1G:
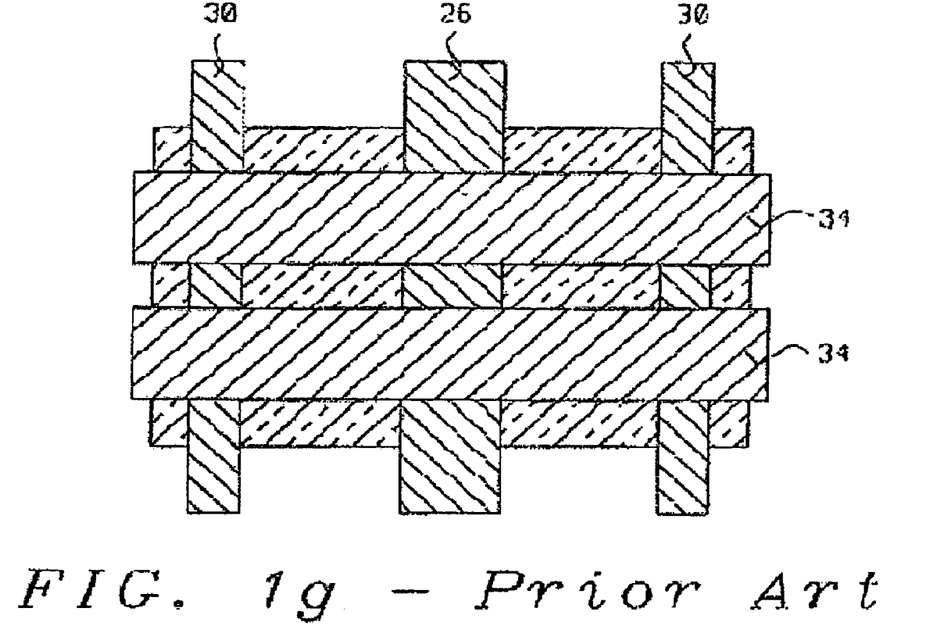
Figure 2A:
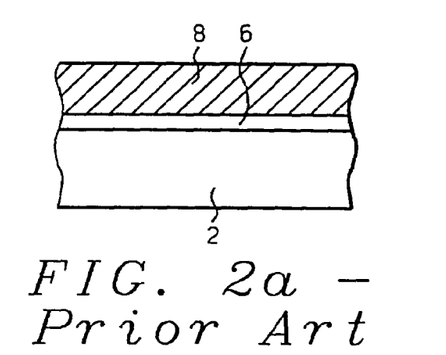
Figure 2B:
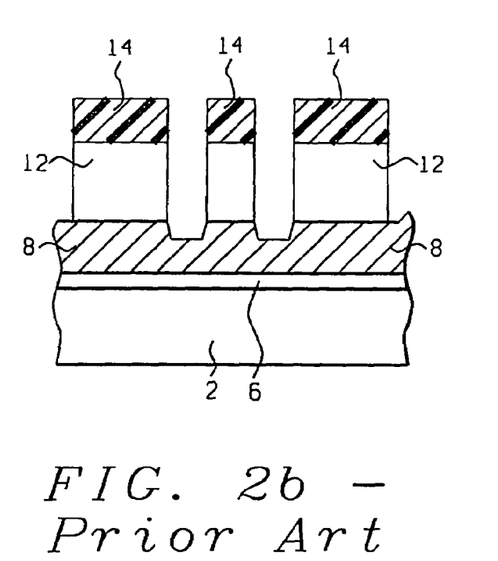
Figure 2C:
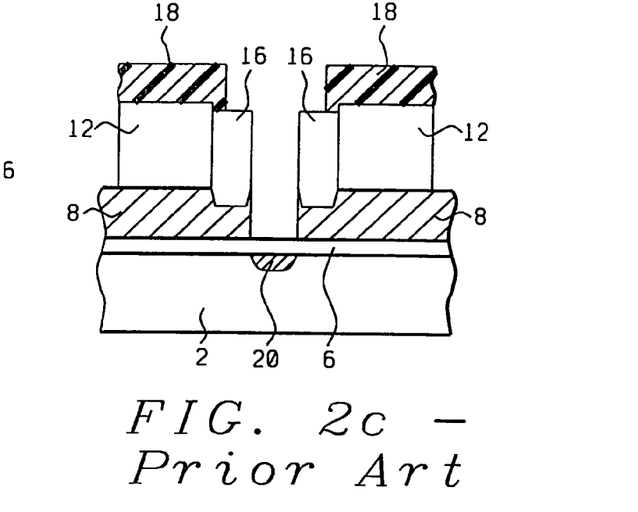
Figure 2F:
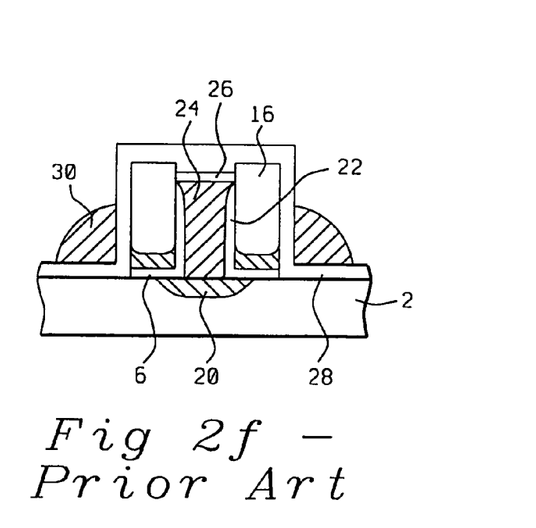
Figure 2G:
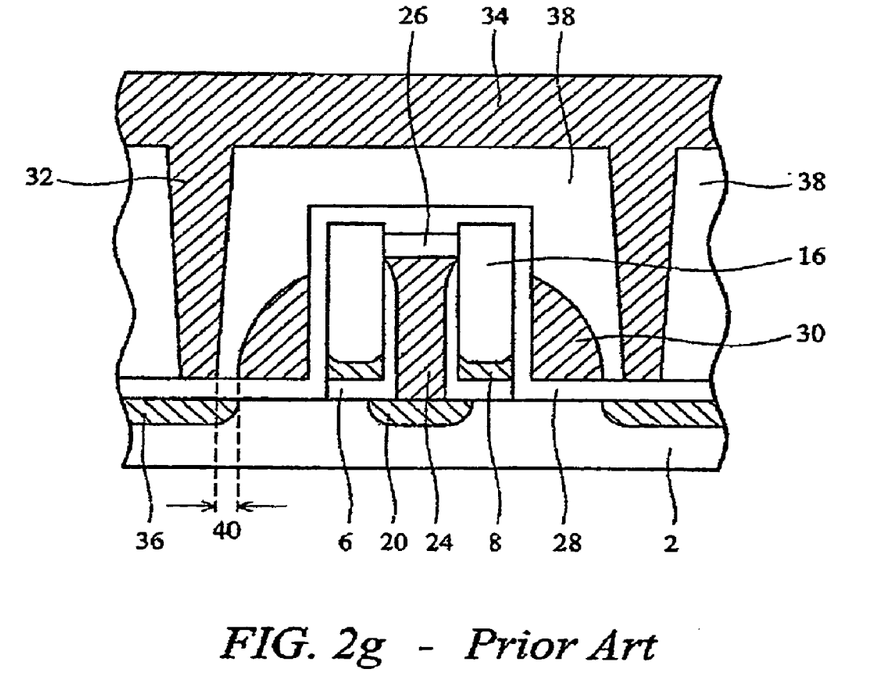

A traditional method of fabricating a split gate flash memory cell is presented in FIGS. 1a–1g, where top views of the cell are presented at successive stages of the process and in FIGS. 2a–2g, which show the corresponding cross-sections. A floating gate oxide, 6, is formed on a semiconductor substrate, 2, which preferably is a silicon substrate, to a thickness of about 80 Angstroms, followed by deposition of a first polysilicon layer, 8, to a depth of about 800 Angstroms. Active regions, 10, are defined using isolating regions, such as shallow trench isolation regions, 4. This is followed by deposition of a nitride layer, which preferably is a silicon nitride layer to a depth of about 2500 Angstroms. A photoresist layer, 14, is then formed as shown in FIGS. 1b and 2b. The photoresist pattern, 14, is used in etching the silicon nitride layer to achieve the shape of region 12 of FIG. 2b. A first polysilicon etch is performed to achieve the shape of region 8 as shown in FIG. 2b, where the sloped segments of the first polysilicon layer provide improved operation of the memory cell. Details of the method to fabricate such sharp poly tips are presented in U.S. Pat. No. 6,090,668 to Lin et al., which is herein incorporated by reference. After removal of the photoresist, an second oxide layer, 16, is deposited to a thickness of about 3000 Angstroms and a CMP (chemical-mechanical polishing) step is performed. A second photoresist layer, 18, is formed and used in successively etching the silicon nitride layer and the first polysilicon layer to achieve the structure shown in FIGS. 1c and 2c. Source regions 20 are formed by a P ion implantation at energy of about 20 keV and to a dose of about 4E14 per cm2. Removal of the second photoresist layer is followed by deposition of an third oxide layer to a depth of about 500 Angstroms, which enhances the lateral diffusion of the source implant. An third oxide etching step is performed to achieve third oxide spacers, 22. A polysilicon deposition is performed to a depth of about 3000 Angstroms and a CPM step on this layer produces a second polysilicon region 24, which serves to contact the source 20. At this stage the structure is as depicted in FIGS. 1d and 2d. The traditional method proceeds with oxidation of second polysilicon, 24, to form about 200 Angstroms of fourth oxide, 26. Next the nitride layer 12 is removed, and successive etches are performed of the first polysilicon layer, 8, and floating gate first oxide layer, 6. An fifth oxide layer, 28, is grown to a depth of about 170 Angstroms. After a third polysilicon deposition, 30, to about 2000 Angstroms, the structure is as shown in FIGS. 1e and 2e. Etching the third polysilicon layer, poly spacers, 30, are formed that serve as wordlines. A drain implant is now performed that usually is an As implant at energy about 60 keV and to a dose of about 4E15 per cm2. This forms the drain regions 36. An interlevel dielectric (ILD) layer, 38, is deposited. A photoresist layer is formed and patterned so that upon etching of the IDL layer, contacts are opened to the drain regions. A first metal deposition follows removal of the photoresist layer. Another photoresist layer is formed and patterned so that after etching first metal bitlines 34 are formed connecting to the drain regions, 36 through the first metal contact regions 32. This completes the formation of a traditional split gate flash cell, which is shown in FIGS. 1g and 2g.

Bitlines, 34 and bitline contacts, 32 are insulated from the wordlines, 30 by an interlevel dielectric layer, 38. The minimum separation, 40, is between bitline contacts and wordlines and this separation must be maintained large enough so as to avoid possible shorts that could develop between adjacent bitline contacts and wordlines. Bitline contact to wordline separations are determined by the positions of bitline contact openings relative to wordlines and the dimensions of the openings, which are set by design rules. In arriving at the design rule the possibility of misalignment and variability in the production of contact openings must be taken into account, which results in a required minimum separation well beyond that needed to avoid development of shorts. This requirement for increased separation limits the ability to decrease cell size. Self-alignment of the bitline contact to the wordline, as in the structures disclosed by the present invention, eliminates the reliability issue, allows a reduction in cell area and facilitates shrinking the cell size.

A split-gate flash memory cell having self-aligned source line and a novel polysilicon gate tip for enhanced F—N tunneling is disclosed in U.S. Pat. No. 6,259,131 to Sung et al. In U.S. Pat. No. 6,204,126 to Hsieh et al. there is disclosed a method for forming a split-gate flash memory cell where the floating gate of the cell is self-aligned to isolation, to source and to wordline. In U.S. Pat. No. 6,242,308 to Hsieh et al. there is disclosed a method for forming a split-gate flash memory cell having a thin floating gate and a sharp polysilicon gate tip to improve the programming and erasing speed of the cell. A method for fabricating a split-gate flash memory cell utilizing step poly to improve cell performance is provided in U.S. Pat. No. 6,229,176 to Hsieh et al.

SUMMARY OF THE INVENTION

It is a primary objective of the invention to provide a split gate flash cell with self-aligned bitline contact to wordline, self aligned wordline to floating gate and self aligned source line to floating gate. It is also a primary objective of the invention to provide a method of forming a split gate flash cell with self-aligned bitline contact to wordline, self aligned wordline to floating gate and self aligned source line to floating gate. Furthermore, it is a primary objective of the invention to provide a structure allowing a reduction in cell size, resulting in improved performance and packing density.

A new structure for split gate flash memory devices is disclosed with multi-self alignment. Active regions, arranged in rows, are disposed over a semiconductor region and separated by isolation regions. Split gate memory cells are arranged in identical order along the rows of active regions, each element being composed of four elements: drain, wordline, floating gate and source elements denoted by D, W, F and S respectively, which are arranged as P . . . DWFSFWDWFSFD . . . T, with P and T being the first and last elements of a row are either drain or source elements, so that drain elements, which adjoin wordline elements on either side, and source elements, which adjoin floating gate elements on either side, are each shared by two memory cells. Floating gate elements are composed of a gate insulator layer disposed over the semiconductor region, conductive floating gates disposed over the gate insulator layer, an insulator layer disposed over the floating gates, and sidewall insulator layers. Source elements, self aligned to said adjoining floating gate elements, are composed of source regions, contained within the semiconductor region, extending below the adjoining floating gate elements, with conductive source pick up lines disposed over and electrically connected to the source regions and which electrically connect corresponding source regions of all rows, and with a source element insulator layer disposed over the source pick up lines. Wordline elements, self aligned to floating gate elements on one side and drain elements on the other side, are composed of a wordline gate insulator layer disposed over the semiconductor region, with conductive wordline disposed over the wordline gate insulator that connect corresponding wordline elements of all rows, with a wordline insulator layer disposed over the wordlines and with wordline sidewall insulator layers on side walls facing drain regions. Drain elements, self aligned to said adjoining wordline elements, are composed of drain regions, contained within the semiconductor region, with conductive drain pick up lines disposed over and electrically connected to the drain regions and which electrically connect all drain regions for each row.

BRIEF DESCRIPTION OF THE DRAWINGS

In the accompanying drawing forming a material part of this description, there is shown.

DESCRIPTION OF THE PREFERRED EMBODIMENTS

Figure 3A:
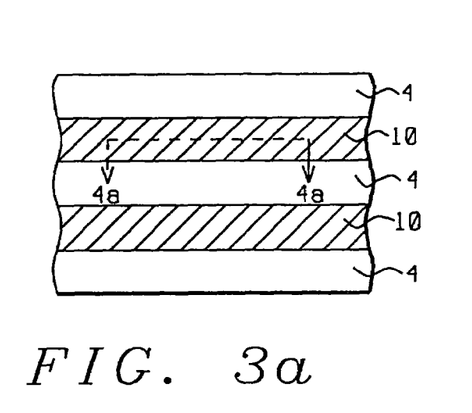
FIGS. 3a–3g show top views depicting a method of forming split gate flash memory cells according to the invention.
Figure 3B:
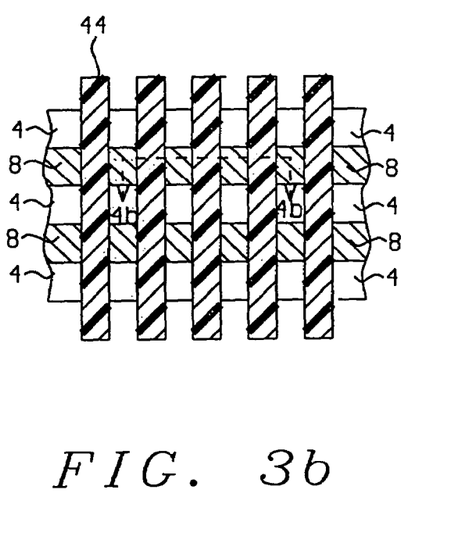
Figure 3C:
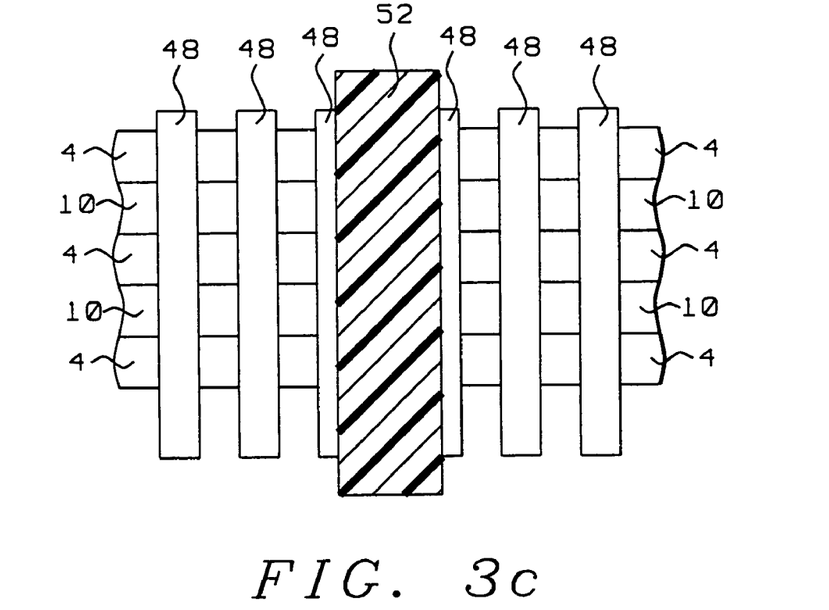
Figure 3D:
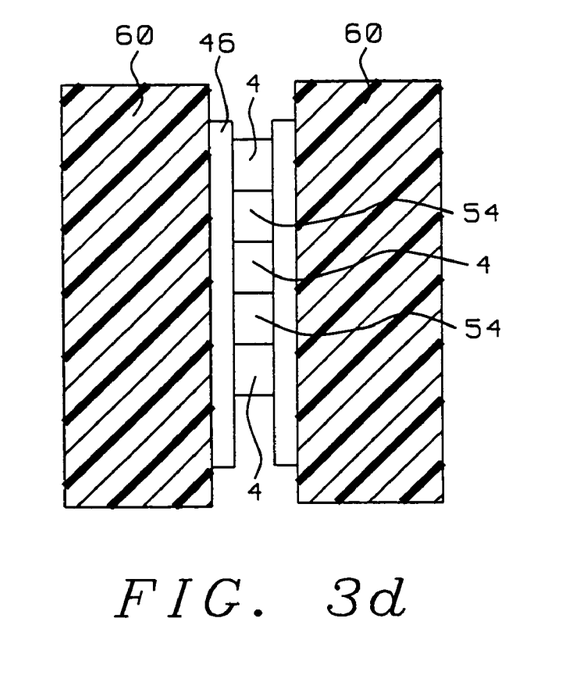
Figure 3E:
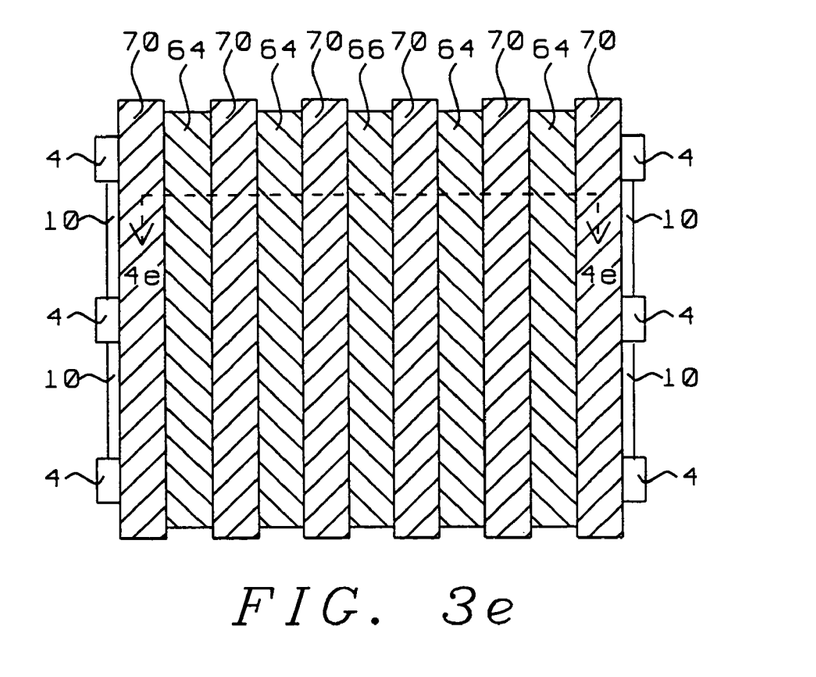
Figure 3F:
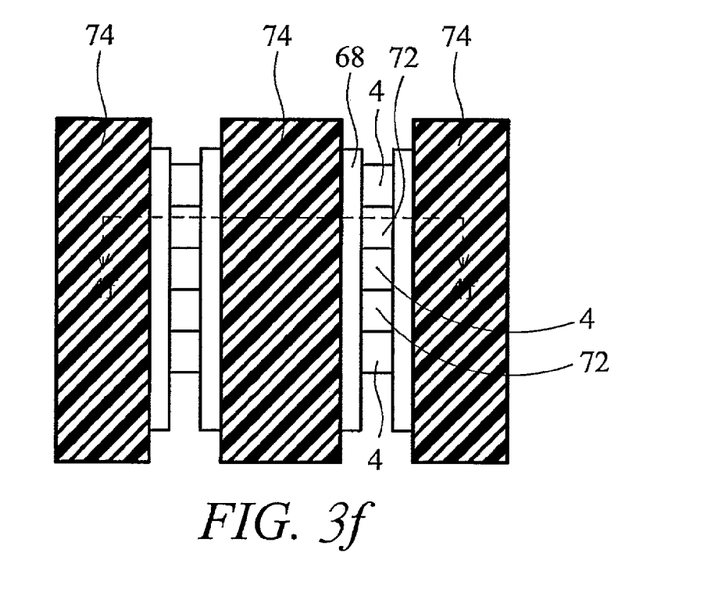
Figure 3G:
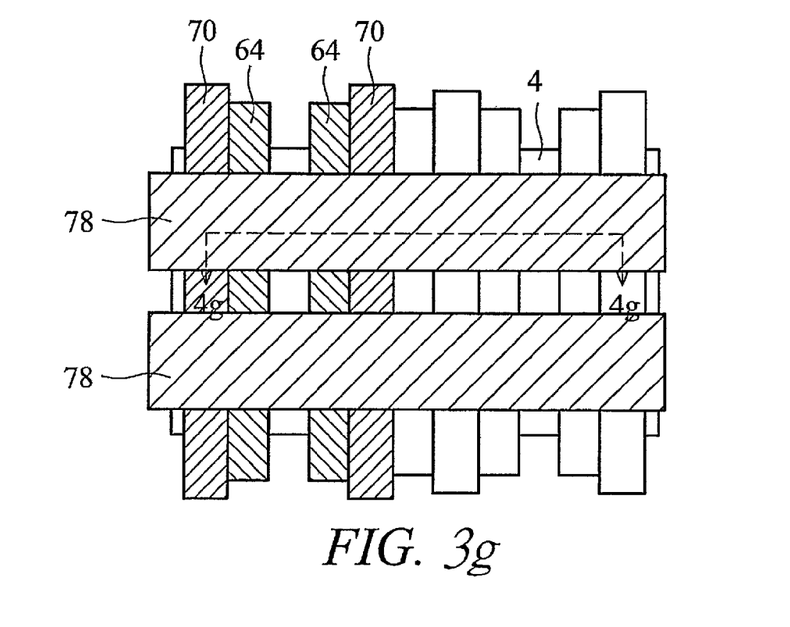
Figure 4A:
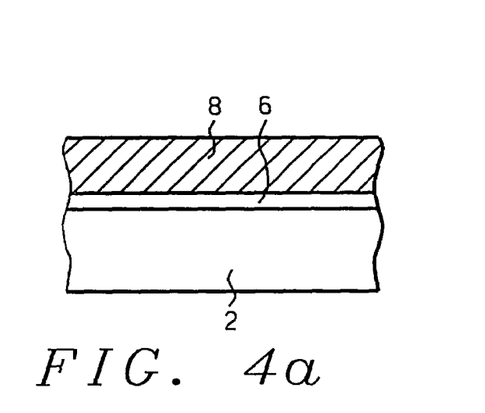
FIGS. 4a–4g show cross sectional views depicting a method of forming split gate flash memory cells according to the invention.
Figure 4B:
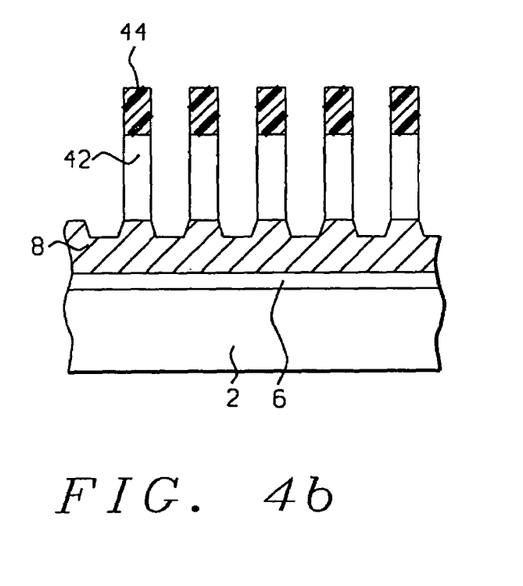
Figure 4C:
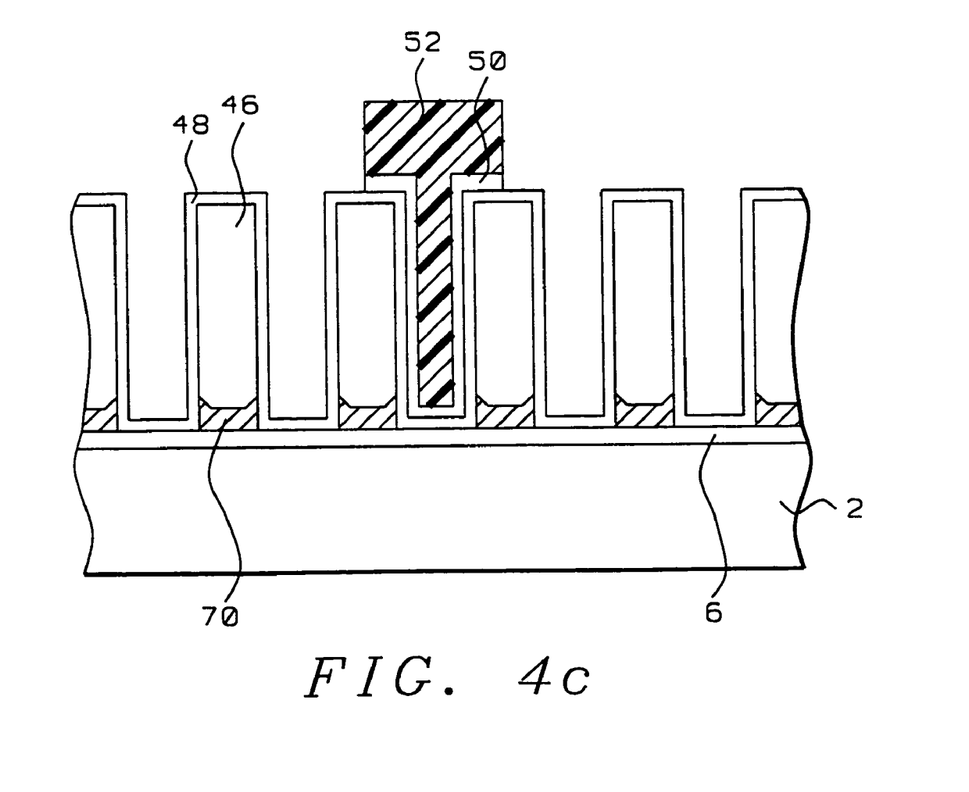
Figure 4D:
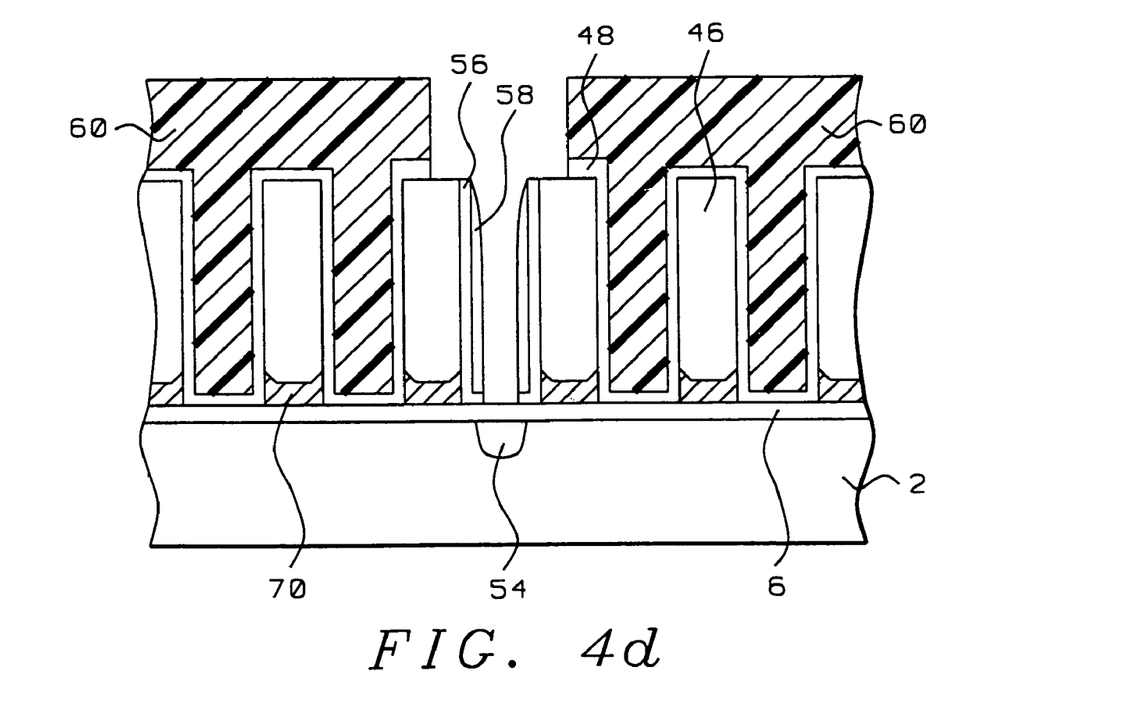
Figure 4E:
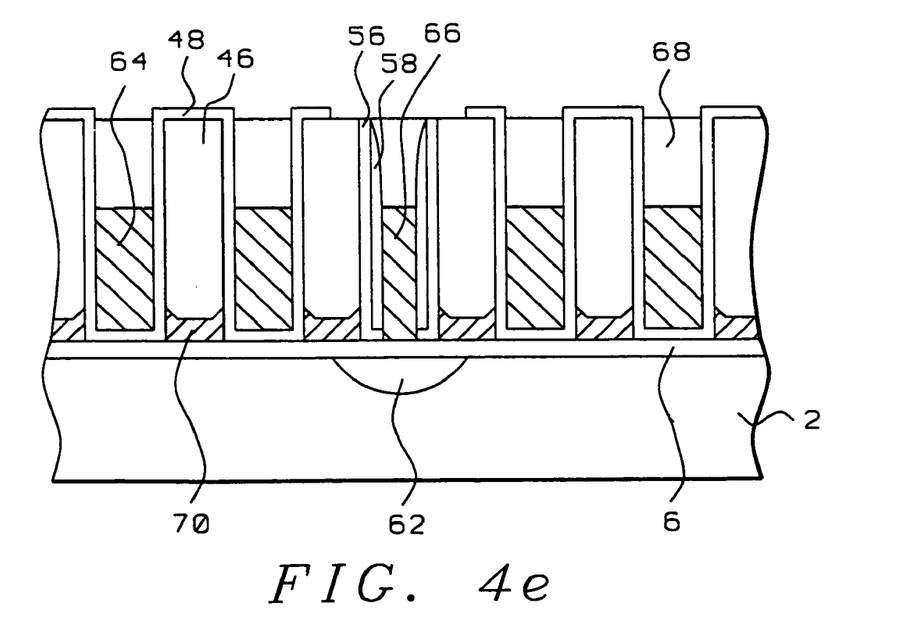
Figure 4F:
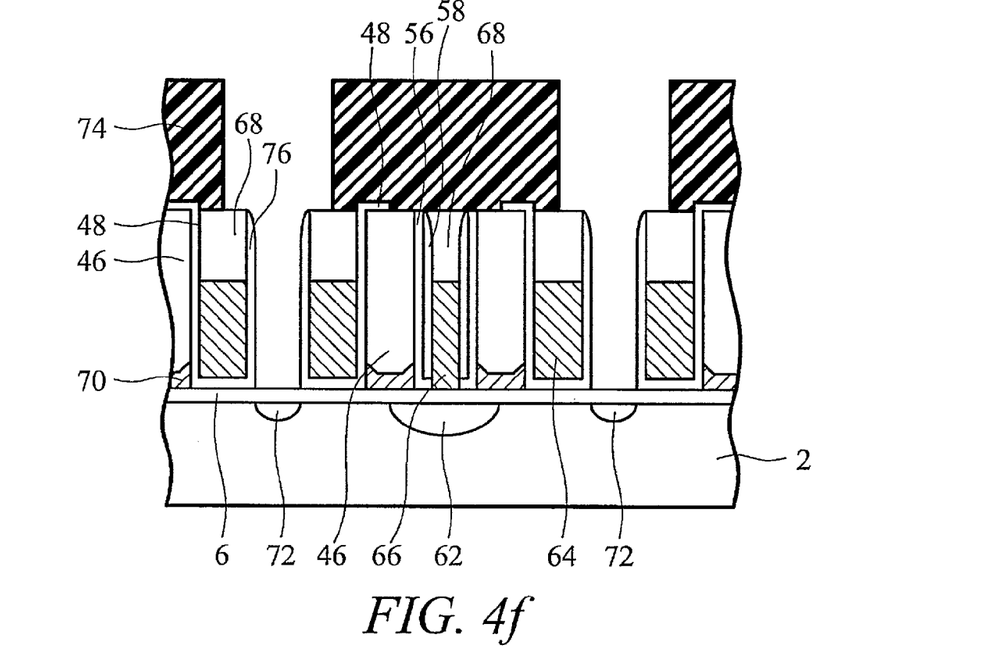
Figure 4G:
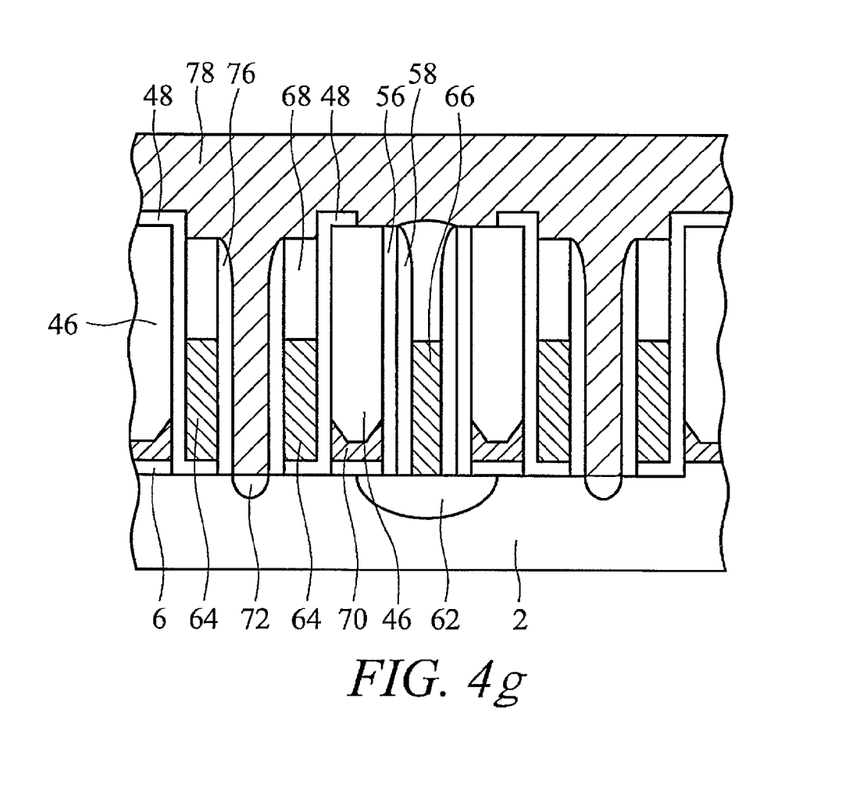

Preferred embodiments of the invention are well described with the aid of FIGS. 3a–3g and 4a–4g. A method of fabricating a novel split gate flash memory cell is presented in FIGS. 3a–6g, where top views of the cell are presented at successive stages of the process and in FIGS. 4a–4g, which show the corresponding cross-sections. A floating gate oxide, 6, is formed on a semiconductor substrate, 2, which preferably is a silicon substrate, to a thickness of about 80 Angstroms, followed by deposition of a doped first polysilicon layer, 8, to a depth of about 800 Angstroms. The first polysilicon layer, and also the subsequent doped polysilicon layers, is phosphorus doped either in situ or by ion implantation to achieve a high conductivity. Active regions, 10, are defined using isolating regions, such as shallow trench isolation regions, 4. This is followed by deposition of a first insulator layer, which preferably is a silicon nitride layer, to a depth of about 2500 Angstroms. The first insulator layer is patterned to achieve the shape of region 42, extending in a direction perpendicular to the active regions, which will be denoted, the row direction. A preferred method for obtaining the shape of region 42 is to first form a photoresist layer, 44, as shown in FIGS. 3b and 4b. The photoresist pattern, 44, is used in etching the first insulator layer to achieve the shape of region 42 of FIG. 4b. Preferably, an etch is then performed to achieve the shape of region 8 as shown in FIG. 4b, where the sloped segments of the first conductor layer, to be fashioned to be the floating gates, will provide improved operation of the memory cell Details of the method to fabricate such sharp poly tips are presented in U.S. Pat. No. 6,090,668 to Lin et al., which is herein incorporated by reference. A second insulator layer, preferably an oxide layer is deposited to a thickness of about 3000 Angstroms and a CMP (chemical-mechanical polishing) step is performed so that the second insulating layer is formed into sections, 46, that are over the first conductor layer and intervene with sections of the first insulator layer. A selective etch is now performed to remove the sections of first insulator layer. This requires that good selectivity is possible with respect to the second insulating layer. For the preferred choices of nitride for the first insulating layer and oxide for the second insulator layer, this is well known to be the case. The first conducting layer and floating gate insulator layer, that were disposed under the sections of first insulator layer, are now successively etched. This is followed by the deposition of two insulator layers. A third insulator layer, 48, deposited first, is preferably an oxide layer about 150 Angstroms thick and a fourth insulating layer is preferably a nitride film about 350 Angstroms thick. The fourth insulator layer is patterned to achieve the shape indicated shown as region 50 in FIG. 4c. A preferred procedure to obtain this patterning is to form a photoresist layer, 52, and perform a selective etch of the exposed fourth insulator layer without etching the third insulating layer. It is well known how to achieve this selectivity when preferred materials, oxide for the third insulator layer and nitride for the fourth insulator layer, are used. At this point the structure is as shown in FIGS. 3c and 4c. The sections containing fourth insulator layers are source sections. Source regions 54 are formed by ion implantation through these sections, which is performed after masking all but the source sections and etching the third and fourth insulator layers to remove these layers from above the semiconductor region, 2, and to form insulator spacers 56 and 58. The masking is preferably accomplished using a patterned photoresist layer, 60. Phosphorus ion implantation is preferred for the source implant, at energy of about 20 keV and to a dose of about 4E14 per cm2. A source implant anneal is performed, at about 900 degrees C., to obtain an enlarged source region, 62. Next a second conductor layer, which preferably is a polysilicon layer, is deposited to a depth of about 3000 Angstroms, and etched back to form wordlines 64, and source pick up lines 66. At this stage of the process, the source regions, 54 are self aligned to the floating gates 70 and the source pick up lines are self aligned to the source regions and to the floating gates.

This is followed by deposition of a fifth insulator layer, preferably a nitride layer to a depth of about 2000 Angstroms, which is then etched back to achieve the fifth insulator sections 68, isolating the word lines 64 and the source pick up lines 66. A masking step is now performed to open the drain areas, 72. This can be accomplished by patterning a photoresist layer, 74, and removing the material from the drain areas, 72, by etching the third insulator layer, 48, the second insulator layer, 46, the first conductor layer, 8, and the floating gate insulator layer. Drain ion implantation is now performed, which preferably is As ion implantation to a dose of about 4E15 pr cm2 at an energy of about 60 keV, forming drain regions 80. A sixth insulator layer is then deposited, which preferably is an oxide layer, to a depth of about 500 Angstroms and etched to form insulating spacers, 76. Finally a third conductor layer is deposited, which preferably is a polysilicon layer, to a depth of about 3000 Angstroms and patterned to be drain pick up lines, 78. This patterning can preferably be accomplished using photoresist. The drain pick up lines are bitlines running in the row direction. Thus drain pick tip lines are self aligned to drain regions and both are self aligned to wordlines.

Figure 5:
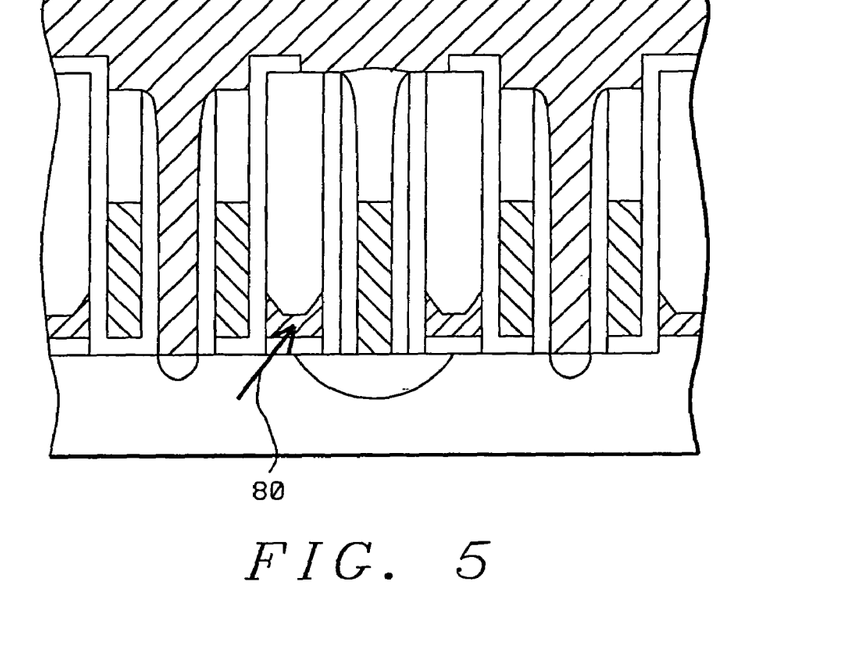
FIG. 5 shows the programming method of a split gate flash memory cell according to the invention.
Figure 6:
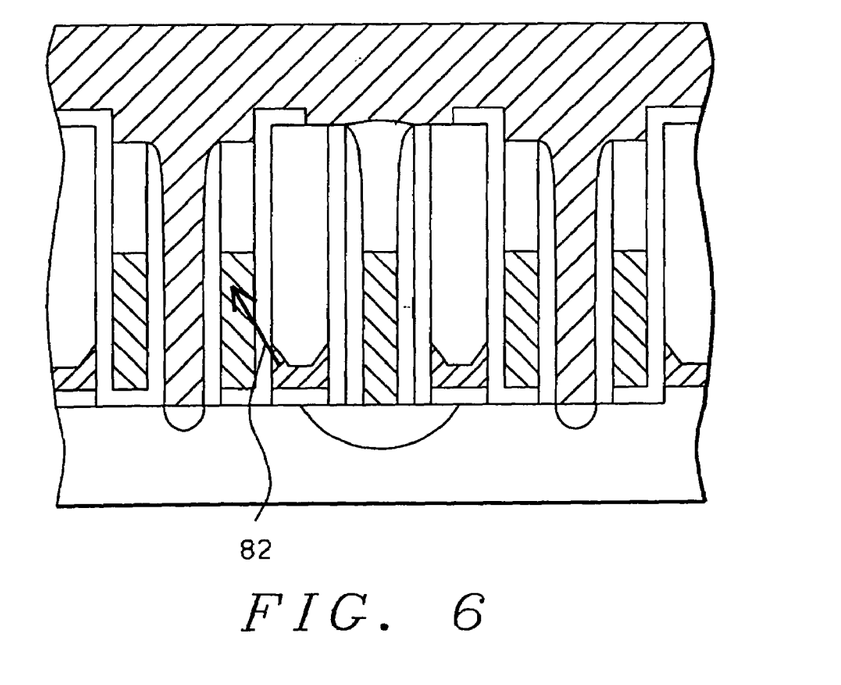
FIG. 6 shows the erasing method of a split gate flash memory cell according to the invention.

Programming of split gate memory cells according to the invention is by the mechanism of source side injection. Channel electrons are raised in energy and are injected into the floating gates as indicated by the arrow, 80, in FIG. 5, charging the floating gates. The erasing operation, in which the floating gates are discharged, is accomplished by electron tunneling through the sidewall insulator into the adjacent wordline, as indicated by the arrow, 82, in FIG. 6. Sloped floating gates increase the tunneling rate and thus lead to an enhanced efficiency of the erasing operation. It is a primary objective of the invention to provide a split gate flash cell with self-aligned bit contact to word line, self aligned word line to floating gate and self aligned source line to floating gate. It is also a primary objective of the invention to provide a method of forming a split gate flash cell with self aligned bit contact to word line, self aligned word line to floating gate and self aligned source line to floating gate. Furthermore, it is a primary objective of the invention to provide a structure allowing a reduction in cell area and further facilitating shrinking of the cell size, resulting in improved performance and packing density. These objectives are well accomplished by the embodiments of the invention. The memory cells of preferred embodiments of the invention are arranged in the row direction, along the active regions, 10. There are four elements in a cell, drain, wordline, floating gate and source elements, denoted by D, W, F and S respectively, with the drain and source elements each shared by two cells. The order of the elements along the row is . . . DWFSFWDWFSFWDW . . . so that drains have wordlines adjacent on either side and sources have floating gates adjacent on either side. With the active regions having layers appropriate to form floating gate elements, i.e. a gate insulator layer, a conductor layer and an insulator layer, but before sidewall spacers are formed, they can be patterned as . . . P . . . YXF*XF*XYXF*XF* . . . T, with P and T being first and last elements can be either X or Y elements and where F* denotes an unfinished floating gate element, X denotes an empty section and Y, which are in the drain positions, is a sacrificial element that can be the same as the floating gate element, except that it is to be removed. This order of the elements is shown in FIG. 4c, however without regions 48, 50 and 52. Source elements are now formed in the empty sections between the floating gate elements. First spacers are formed to insulate the floating gate sidewalls. Ion implantation onto the semiconductor regions between floating gate elements forms source regions self aligned to the adjoining floating gate elements. A conductor layer is deposited and etched back so that the conducting layer is only within the cavities in the "X" positions, and, in the same way, an insulator layer is deposited over the conductor layer and etched back so that it too exists only within the cavities in the "X" positions. Thus, source pick up lines are formed self-aligned to source regions, running in the column direction and contacting to corresponding source regions of all the rows. The same processing steps, conductor layer deposition and etch back and insulator layer deposition and etch back, at the same time form wordline elements self aligned between floating gate elements and sacrificial elements. Wordlines also run in the column direction connecting corresponding wordline elements of all the rows. At this stage only the drain elements need to be formed so that the sections along a row are . . . YWFSFWYWFSF . . . and the next step is to eliminate the sacrificial elements. The finished floating gate elements are now denoted F. Masking to expose the sacrificial elements, as in FIG. 4f; and etching, stopping at the surface of the semiconductor region, removes the material of the sacrificial elements. Materials for the wordline elements and for the sacrificial elements need to be chosen so that the sacrificial elements can be selectively etched. Spacers are formed to insulate the wordline element sidewalls. Ion implantation onto the semiconductor regions between wordline elements forms drain regions self aligned to the adjoining wordline elements. A conductor layer is deposited contacting the drain regions and patterned to be drain pick up lines. The drain pick up lines are bitlines running in the row direction. Thus drain pick up lines are self aligned to drain regions and both are self aligned to wordlines.

While the invention has been particularly shown and described with reference to the preferred embodiments thereof, it will be understood by those skilled in the art that various changes in form and detail may be made without departing from the spirit and scope of the invention.

What is claimed is:

1. A structure for split gate flash memory device, comprising:

a substrate comprising a drain region and a source region;

a floating gate structure disposed on the substrate and partially overlaying the source region, the floating gate structure comprising a floating gate oxide layer, a floating gate and a first insulating layer;

a second insulating layer disposed at a first side of the floating gate structure, and extended to a top surface of the floating gate structure from the surface of the substrate, wherein a portion of the top surface of the floating gate structure is uncovered by the second insulating layer;

a word line disposed on the sidewall of the second insulating layer;

a first spacer layer disposed on the sidewall of the word line, wherein the first spacer layer is adjacent to the drain region without covering the drain region; and a second spacer layer disposed on a second side of the floating gate structure and on the source region.

2. The structure of claim 1, further comprising a third insulating layer disposed on the word line and between the first spacer and the second insulating layer.

3. The structure of claim 1, further comprising a source pick up line disposed on the sidewall of the second spacer layer and on the source region.

4. The structure of claim 1, further comprising a drain pick up line disposed on the drain region and self aligned to the drain region.

5. The structure of claim 1, wherein the word line is self aligned to the floating gate structure on one side and the drain region on the other side.

6. The structure of claim 1, wherein the source region is self aligned to the floating gate structure.

7. The structure of claim 2, wherein the second spacer layer comprises a first insulate spacer and a second insulate spacer, the first insulate spacer is disposed between the gate structure and the second insulate spacer.

8. The structure of claim 7, wherein the floating gate, the word line and the drain pick up line comprise polysilicon.

9. The structure of claim 7, wherein the second insulate spacer and the third insulating layer comprise oxide.

10. The structure of claim 7, wherein the floating gate oxide layer, the first insulating layer, the first spacer layer and the second insulate spacer comprise nitride.

11. The structure of claim 1, wherein the word line is disposed between the first spacer and the second insulating layer.

12. The structure of claim 1, wherein the second spacer layer comprises a first insulating spacer and a second insulating spacer made by different materials.

13. The structure of claim 1, wherein the first insulating layer is disposed on a top surface of the floating gate.

14. A structure for split gate flash memory device, comprising:

a substrate comprising a drain region and a source region;

a floating gate structure disposed on the substrate and partially overlaying the source region, the floating gate structure comprising a floating gate oxide layer, a floating gate and a cap layer;

a second insulating layer disposed at a first side of the floating gate structure and partially extended to a top surface of the floating gate structure from the surface of the substrate, wherein a portion of a top surface of the floating gate structure is uncovered by the second insulating layer;

a word line disposed on the sidewall of the second insulating layer;

a first spacer layer disposed on the sidewall of the word line;

a second spacer layer disposed on a second side of the floating gate structure and on the source region; and a drain pick up line disposed on the drain region and self aligned to the drain region.

15. A structure for split gate flash memory device, comprising:

a substrate comprising a drain region and a source region;

a floating gate structure disposed on the substrate and partially overlaying the source region, the floating gate structure comprising a stack of a floating gate oxide layer, a floating gate and a first insulating layer, wherein the floating gate oxide layer is disposed on the substrate the floating gate is disposed on the floating gate oxide layer and the first insulating layer is disposed on the floating gate;

a second insulating layer disposed at a first side of the floating gate structure, extended to a top surface of the floating gate structure from the surface of the substrate, and partially exposed a portion of the top surface of the floating gate structure;

a word line disposed on the sidewall of the second insulating layer;

a first spacer layer disposed on the sidewall of the word line, wherein the first spacer layer is adjacent to the drain region without covering the drain region; and a second spacer layer disposed on a second side of the floating gate structure and on the source region.

* * * * *